(12) United States Patent
An et al.

(10) Patent No.: US 12,169,156 B2
(45) Date of Patent: Dec. 17, 2024

(54) TEST MANAGEMENT MODULE AND VEHICLE TEST SYSTEM HAVING THE SAME

(71) Applicant: SEMES CO., LTD., Cheonan-si (KR)

(72) Inventors: Seung Wan An, Hwaseong-si (KR); Jae Uk Kim, Seoul (KR); Min Gi Choi, Incheon (KR); Hyun Seong Moon, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 365 days.

(21) Appl. No.: 17/692,578

(22) Filed: Mar. 11, 2022

(65) Prior Publication Data

US 2022/0291088 A1 Sep. 15, 2022

(30) Foreign Application Priority Data

Mar. 12, 2021 (KR) ........................ 10-2021-0032746

(51) Int. Cl.
*G01M 17/08* (2006.01)
*H01L 21/677* (2006.01)

(52) U.S. Cl.
CPC ....... *G01M 17/08* (2013.01); *H01L 21/67724* (2013.01); *H01L 21/67733* (2013.01)

(58) Field of Classification Search
CPC .... G01M 17/08; G01M 17/00; G01M 99/008; H01L 21/67724; H01L 21/67733; H01L 21/67253; G01R 31/2834; G01R 31/2836; G01R 31/2848
See application file for complete search history.

(56) References Cited

U.S. PATENT DOCUMENTS

| 9,940,840 B1* | 4/2018 | Schubert | ................ G06Q 30/06 |
| 2010/0083056 A1* | 4/2010 | Spier | ................... G06F 11/0739 |
| | | | 714/E11.024 |

\* cited by examiner

*Primary Examiner* — Tung S Lau
(74) *Attorney, Agent, or Firm* — KILE PARK REED & HOUTTEMAN PLLC

(57) ABSTRACT

A test management module includes a test manager writing a test list, a first emulator controlling an operation of the vehicle according to instruction of the test manager, and a controller controlling an operation of a test station according to instruction of the test manager. The test list includes an event condition to be generated in a vehicle and operation information of the operation of the vehicle, which is performed when the event condition is satisfied, and the operation of the test station provided to virtually test the vehicle.

10 Claims, 2 Drawing Sheets

TEST MANAGEMENT MODULE AND VEHICLE TEST SYSTEM HAVING THE SAME

CROSS-REFERENCE TO RELATED APPLICATION

This application claims priority to Korean Patent Application No. 10-2021-0032746, filed on Mar. 12, 2021, and all the benefits accruing therefrom under 35 U.S.C. § 119, the contents of which are incorporated by reference in their entirety.

TECHNICAL FIELD

The disclosure relates to a test management module and a vehicle test system having the same. More particularly, the disclosure relates to a test management module capable of managing test of a vehicle transporting a carrier, and a vehicle test system having the same.

BACKGROUND

Generally, a semiconductor processing apparatuses for manufacturing a semiconductor device are sequentially arranged to perform various processes on a semiconductor substrate. An object for performing a manufacturing process of the semiconductor device is received in a carrier. The object may be provided to each semiconductor processing apparatus or may retrieve the object from the semiconductor processing apparatus using the carrier.

The carrier is transported by an overhead hoist transport apparatus. The overhead hoist transport apparatus includes a driving rail provided along a ceiling of a space, in which the semiconductor processing apparatus, and a vehicle gripping the carrier to drive along the driving rail.

The vehicle is tested whether the vehicle operates normally. The vehicle is tested while the vehicle actually driven along the driving rail. Since the vehicle test stops the operation of the overhead hoist transport apparatus, the efficiency of the overhead hoist transport apparatus may be deteriorated. Also, a safety accident may be occurred during the vehicle test.

Since the vehicle is tested during the actual driving of the vehicle along the driving rail, the test of the vehicle cannot be automated.

SUMMARY

The example embodiments of the inventive concept provides a test management module automatizing the test of a vehicle, and a vehicle test system having the same.

According to one exemplary embodiment of the inventive concept, a test management module includes a test manager writing a test list, a first emulator controlling an operation of the vehicle according to instruction of the test manager, and a controller controlling an operation of a test station according to instruction of the test manager. The test list includes an event condition to be generated in a vehicle and operation information of the operation of the vehicle, which is performed when the event condition is satisfied, and the operation of the test station provided to virtually test the vehicle.

In one exemplary embodiment, the test manager may receive a first test result value from the vehicle according to the test list, and compare the first test result value and a predicted first test value to determine a state of the vehicle.

In one exemplary embodiment, the test manager may receive a second test result value from the test station according to the test list, and compare the second test result value with a predicted second test value to determine the state of the vehicle.

In one exemplary embodiment, the test management module may further include a simulator providing virtual data to the vehicle, which is the same as data generated during the operation of the vehicle, to test a software of the vehicle.

In one exemplary embodiment, the vehicle may include a main controlling part operating unit elements forming the vehicle; and a data receiving part receiving the virtual data from the simulator.

In one exemplary embodiment, the test management module may further include a second emulator controlling operations of a plurality of unit elements, and the plurality of unit elements may be included in the vehicle.

In one exemplary embodiment, the second emulator may be provided to independently test the unit elements regardless of the test list.

In one exemplary embodiment, the test manager may be provided to determine whether the vehicle satisfies the event condition of the vehicle according to the test list.

According to one exemplary embodiment of the inventive concept, a vehicle test system includes a vehicle including driving wheels and a plurality of sensors; a test station supporting the driving wheels of the vehicle to drive the vehicle at a same position; and a test management module. The test management module includes a test manager writing a test list, a first emulator controlling an operation of the vehicle according to the test list and according to instruction of the test manager, and a controller controlling an operation of the test station according to the test list and according to instruction of the test manager. The test list includes an event condition to be generated in the vehicle; and operation information of the operation of the vehicle, which is performed by the vehicle when the event condition is satisfied, and the operation of the test station virtually testing the vehicle;

In one exemplary embodiment, the test manager may receive a test result value from the vehicle according to the test list, and compare the test result value and a predicted test value to determine a state of the vehicle.

In one exemplary embodiment, the test manager may receive a second test result value from the test station according to the test list, and compare the second test result value with a predicted second test value to determine the state of the vehicle.

In one exemplary embodiment, the test management module may further include a simulator providing virtual data to the vehicle, which is the same as data generated during the operation of the vehicle, to test a software of the vehicle.

In one exemplary embodiment, the vehicle may include a main controlling part operating unit elements forming the vehicle; and a data receiving part receiving the virtual data from the simulator.

In one exemplary embodiment, the test management module may further include a second emulator controlling operations of a plurality of unit elements forming the vehicle.

In one exemplary embodiment, the second emulator may be provided to independently test the unit elements regardless of the test list.

In one exemplary embodiment, the test manager may be provided to determine whether the vehicle satisfies the event condition of the vehicle according to the test list.

In one exemplary embodiment, the test station may include a map storing unit storing a virtual driving environment map in which the vehicle is virtually driven; a driving unit driving the vehicle at a same position corresponding to the driving wheels of a rail; and a unit under detection provided at a position corresponding to the sensors to be sensed by the sensors of the vehicle.

In one exemplary embodiment, the test station may further include a station manager driving the vehicle along the virtual driving environment map, and control the driving unit and the unit under detection to test the vehicle according to the test list.

According to the inventive concept, the test management module may write the test list, and test the vehicle according to the test list. Thus, the test for the vehicle may be automated. The test management module may precisely test the vehicle according to various event conditions included in the test list.

Also, the vehicle test system according to the inventive concept may test the vehicle while the vehicle is driven at a same position. Since the vehicle is not actually driven, an overhead hoist transport apparatus for testing the vehicle may not be stopped, and the safety accident may be decreased during the test of the vehicle.

BRIEF DESCRIPTION OF THE DRAWINGS

Exemplary embodiments may be understood in more detail from the following description taken in conjunction with the accompanying drawings, in which.

DETAILED DESCRIPTION OF THE EMBODIMENTS

Figure 1:
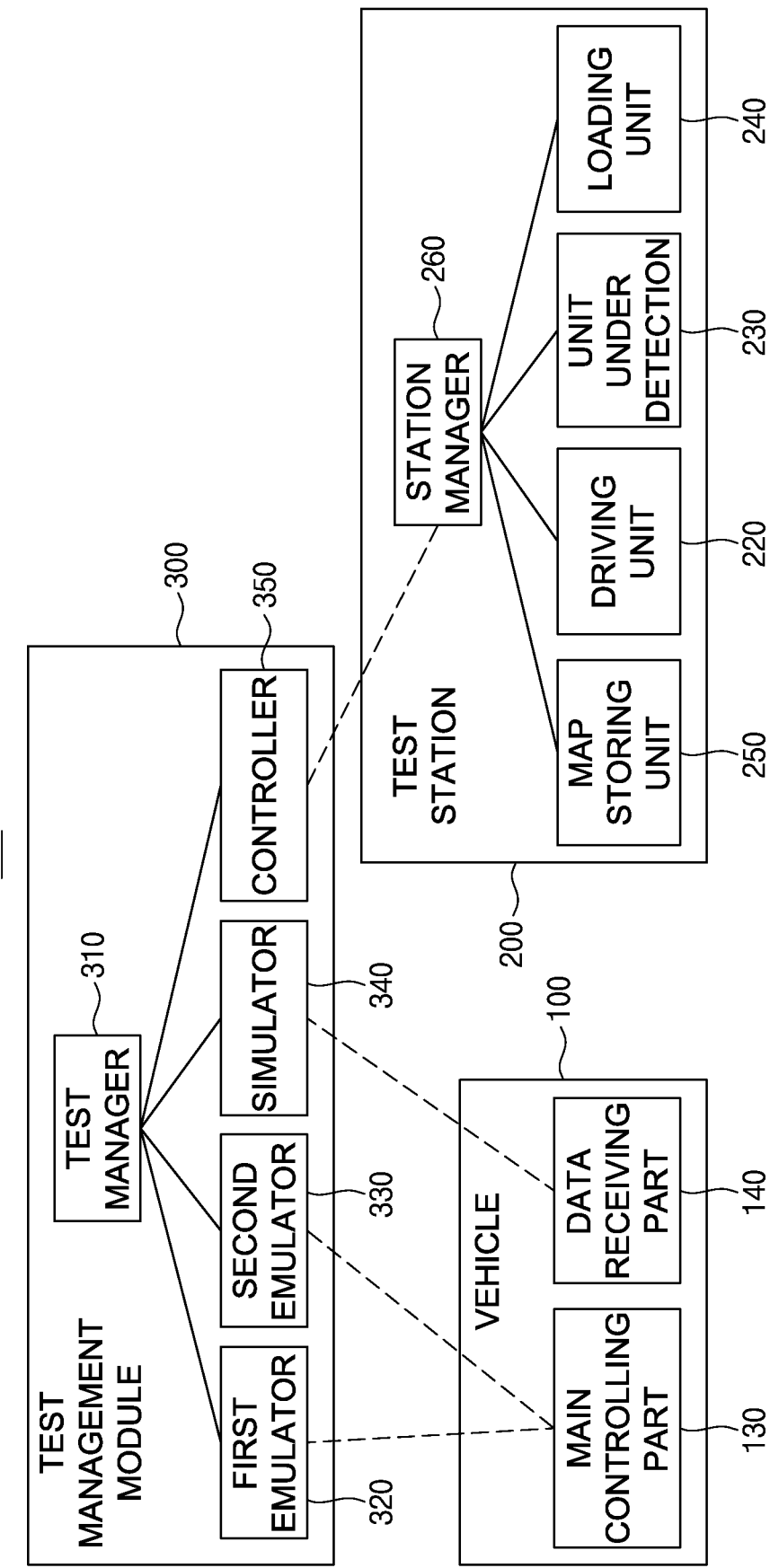
FIG. 1 is a schematic block diagram illustrating a vehicle test system according one embodiment of the inventive concept.

Hereinafter, embodiments of the inventive concept will be described in detail with reference to enclosed drawings. It is important to understand that the inventive concept may be embodied in many alternative forms and should not be construed as limited to the example embodiments set forth herein. While the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept. In describing each drawing, like numerals are used for like elements. In the enclosed drawings, the sizes and relative sizes of layers and regions may be exaggerated for clarity. Like numerals refer to like elements throughout.

It will be understood that, although the terms first, second, etc. may be used herein to describe various elements, these elements should not be limited by these terms. These terms are used to distinguish one element from another. For example, a first element discussed below could be termed a second element without departing from the teachings of the inventive concept. Also, a second element discussed below could be termed a first element without departing from the teachings of the inventive concept.

The terms used in the inventive concept is only used to describe particular embodiments, and it is not intended to limit the inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
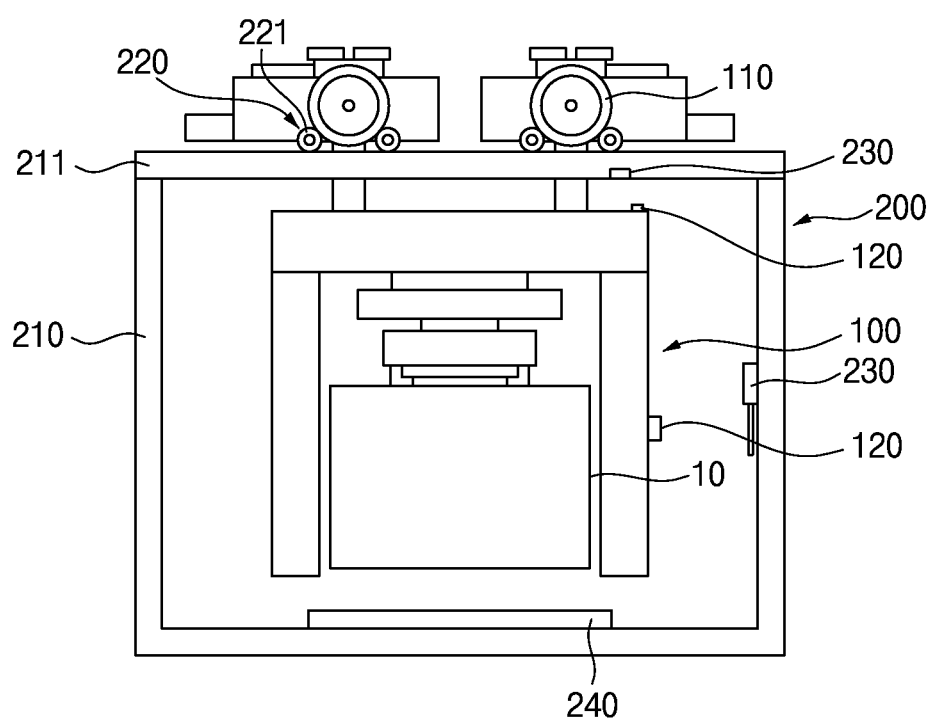
FIG. 2 is a side view illustrating a vehicle and a test station shown in FIG. 1.

FIG. 1 is a schematic block diagram illustrating a vehicle test system according one embodiment of the inventive concept, and FIG. 2 is a side view illustrating a vehicle and a test station shown in FIG. 1.

Referring to FIGS. 1 and 2, the vehicle test system 400 may include a vehicle 100, a test station 200, and a test management module 300.

The vehicle 100 may be driven along a driving rail (not illustrated) to transport a carrier 10. The vehicle 100 includes a driving part, a frame part, a slide part, a hoist part, and a hand part.

The driving part may transport the vehicle 100. Driving wheels 110 are provided on both sides of the driving part. An additional driving part rotates the driving wheels 110.

The frame part is fixed on a lower surface of the driving part. The frame part has a hollow shape to receive the carrier 10. Also, a lower surface and one side surface of the frame part may be opened. Thus, the carrier 10 may be vertically transported in a vertical direction of the vehicle 100, or may be horizontally transported in a horizontal direction of the vehicle 100.

The slide part is provided on an inner upper surface of the frame part. The slide part may horizontally transport the hoist part in the horizontal direction. Here, the hoist part may be transported in the horizontal direction through the opened side surface of the frame part.

The hoist part may be provided on a lower surface of the slide part to be horizontally transported in the horizontal direction.

The hoist part may fix the hand part to elevate the hand part in the vertical direction. For example, the hoist part may fix the hand part by a belt. The hoist part may wind up or wind down to elevate the hoist part.

The hand part is fixed to the belt, and fixes the carrier 10.

The carrier 10 is driven in the horizontal direction by the slide part. The hoist part may elevate the carrier 10.

A plurality of sensors 120 may be provided on an upper surface of a side surface of the frame part.

The sensors 120 may include a tag sensor, a front obstacle sensor, a front distance sensor, a lower obstacle sensor, or the like. The tag sensor may sense a reflector, a barcode, a quick response (QR) code, or the like, which is prepared on a lower surface of the driving rail. The front obstacle sensor may detect a front obstacle. The front distance sensor may sense a distance from another vehicle. The lower obstacle sensor may detect a lower obstacle.

Also, the vehicle 100 may further include a main controlling part 130 and a data receiving part 140.

The main controlling part 130 may operate unit elements forming the vehicle 100, and control the operation.

The data receiving part 140 may receive virtual data, which is the same as data generated during the operation of the vehicle 100 to test software of the vehicle 100. After the data receiving part 140 receives the virtual data, the normality of the operation of the vehicle 100 is checked. Thus, the abnormality of the software of the vehicle 100 may be checked.

The test station 200 supports the driving wheels 110 of the vehicle 100, and drives the vehicle 100 at a same position. The test station 200 tests the vehicle 100.

The test station 200 may include a zig 210, a driving unit 220, a unit 230 under detection, a loading unit 240, a map storing unit 250, and a station manager 260.

The zig 210 receives the vehicle 100 inside thereof, and includes a rail 211 supporting the driving wheels 110 of the vehicle 100.

The driving unit 220 includes rollers 221 provided at a position corresponding to the driving wheels 110 supported by the rail 211. The rollers 221 may be provided to contact the driving wheels 110. Since the rollers 221 contacts the driving wheels 110, the rollers 221 rotate by the rotation of the driving wheels 110. Thus, the vehicles 100 may be driven at the same position without transportation.

The unit 230 under detection is provided at a position corresponding to the sensors 120 to be sensed by the sensors 120 of the vehicle 100. The unit 230 under detection may be selectively sensed by the sensors 120.

For example, the unit 230 under detection may be a reflector sensed by the tag sensor or a display displaying the barcode, the QR code, or the like.

Also, the unit 230 under detection may include a reflecting plate or a sensible member, which is sensed by the front obstacle sensor, the front distance sensor, and the lower obstacle sensor.

The loading unit 240 may load the carrier 10 of the vehicle 100. The loading unit 240 may include a load port, a side buffer, or the like.

The load port may be configured to realize the operation of the load port at a real environment. The load port may be provided under the zig 210.

The side buffer may be configured to realize the operation of the side buffer at the real environment. The side buffer may be provided on a side surface of the zig 210.

The map storing unit 250 stores a virtual driving environment map for virtual driving of the vehicle 100. Multiple virtual driving environment maps may be stored in the map storing unit 250. For example, the virtual driving environment maps may be the same as the driving rail along which the vehicle 100 is actually driven. In other embodiments, the virtual driving environment maps may be generated based on an operation record of the vehicle 100. In other embodiments, the virtual driving environment maps may be generated by a developer based on the operation record of the vehicle 100.

The station manager 260 may control the zig 210, the driving unit 220, the unit 230 under detection, the loading unit 240, and the map storing unit 250 to test the vehicle 100 at the test station 200.

For example, the station manager 260 may drive the vehicle 100 along the virtual driving environment map, and control the operation of the driving unit 220 and the unit 230 under detection based on (or to be consistent with) the virtual driving environment map.

The test management module 300 is configured to manage automatized test of the vehicle 100 at the test station 200. The test management module 300 may include a test manager 310, a first emulator 320, a second emulator 330, a simulator 340, and a controller 350.

The test manager 310 writes a test list including an event condition, and operation information of the operation of the vehicle 100 and the operation of the test station 200. The event condition includes conditions of events, which may be generated during actual driving of the vehicle 100. The operation of the vehicle 100 is performed by the vehicle 100 while the event condition is satisfied. The operation of the test station 200 virtually tests the vehicle 100 performed by the test station 200.

The event condition is a prior condition to the operation of the vehicle 100 and the operation of test station 200. When state of the vehicle 100 satisfies the event condition, the operation of the vehicle 100 and the operation of the test station 200 are performed.

The test list may include various conditions including normal conditions and abnormal conditions, which may be occurred at the vehicle 100.

Also, the test manager 310 may check state information of the vehicle 100 to determine whether the vehicle 100 satisfies the event condition of the test list.

The first emulator 310 is connected to the main controlling part 130 of the vehicle 100 through a communication. When the state of the vehicle 100 satisfies the event condition, the first emulator 320 controls the main controlling part 130, so that the vehicle 100 performs the operation of the vehicle 100 by the instruction of the test manager 310 according to the test list.

The controller 320 is connected to the station manager 260 of the test station 200 through a communication. When the state of the vehicle 100 satisfies the event condition, the controller 320 controls the station manager 260, so that the test station 200 performs the operation of the test station 200 by the instruction of the test manager 310 according to the test list.

The test manager 310 may receive a test result value from the vehicle 100 and the test station 200 according to the test list. The test manager 310 may compare the test result value and a predicted test value according to the test list to determine the state of the vehicle 100. Since the test list may be variously set, the state of the vehicle 100 may be precisely checked.

The second emulator 330 is connected to the main controlling part 130 of the vehicle 100 through a communication. The second emulator 330 may control the operation of the unit elements to test the unit elements forming the vehicle 100.

The second emulator 330 may independently test the unit elements of the vehicle 100 regardless of the test list. Thus, the state of the unit elements of the vehicle 100 may be independently checked.

The simulator 340 is connected to the data receiving part 140 of the vehicle 100 through a communication. The simulator 340 may provide virtual data to the data receiving part 140, which is the same as the data generated during the operation of the vehicle 100. The virtual data may be used to test the software operating the vehicle 100.

According to above embodiments, the test management module according to the inventive concept may write the test list, and test the vehicle according to the test list. Thus, the test for the vehicle may be automatized. The test management module may precisely test the vehicle according to various event conditions included in the test list.

Also, the vehicle test system according to the inventive concept may test the vehicle while the vehicle is driven at the same position. Since the vehicle is not actually driven, an overhead hoist transport apparatus for testing the vehicle may not be stopped, and the safety accident may be decreased during the test of the vehicle.

Although the example embodiments of the inventive concept have been described with reference to the specific embodiments, they are not limited thereto. Therefore, it will be readily understood by those skilled in the art that various modifications and changes can be made thereto without departing from the spirit and scope of the appended claims.

What is claimed is:

1. A semiconductor processing apparatus vehicle test system, comprising:
    a vehicle including:
        driving wheels to roll along a driving rail to transport a carrier while in a semiconductor processing apparatus:
        a vehicle controlling part; and
        a plurality of sensors;
    a test station including:
        a jig that receives the vehicle therein, the jig including a test station rail supporting the driving wheels of the vehicle and including rollers to contact the driving wheels to drive the vehicle at a same position in the test station, and
        a station manager controlling the jig and in communication with the vehicle controlling part; and
    a test management module including:
        a test manager writing a test list, the test list including:
            an event condition to be generated in the vehicle in the test station; and
            operation information of an operation of the vehicle in the test station, which is performed by the vehicle when the event condition is satisfied, and an operation of the test station virtually testing the vehicle;
        a first emulator in communication with the vehicle communication part and controlling the operation of the vehicle in the test station according to the test list and according to instruction of the test manager; and
        a controller in communication with the station manager and controlling the operation of the test station according to the test list and according to instruction of the test manager.

2. The vehicle test system of claim 1, wherein the test manager receives a test result value from the vehicle according to the test list, and compares the test result value and a predicted test value to determine a state of the vehicle.

3. The vehicle test system of claim 1, wherein the test management module further comprises a simulator providing virtual data to the vehicle, which is the same as data generated during the operation of the vehicle, to test a software of the vehicle.

4. The vehicle test system of claim 1, wherein the test management module further comprises a second emulator in communication with the vehicle communication part and controlling operations of a plurality of unit elements forming the vehicle.

5. The vehicle test system of claim 1, wherein the test manager is provided to determine whether the vehicle satisfies the event condition of the vehicle according to the test list.

6. The vehicle test system of claim 1, wherein the test station comprises:
    a map storing unit storing a virtual driving environment map in which the vehicle is virtually driven;
    a driving unit driving the vehicle at & the same position driving; and
    a unit under detection provided at a position corresponding to the sensors to be sensed by the sensors of the vehicle.

7. The vehicle test system of claim 2, wherein the test manager receives a second test result value from the test station according to the test list, and compares the second test result value with a predicted second test value to determine the state of the vehicle.

8. The vehicle test system of claim 3, wherein the vehicle comprises:
    a main controlling part operating unit elements forming the vehicle; and
    a data receiving part receiving the virtual data from the simulator.

9. The vehicle test system of claim 4, wherein the second emulator is provided to independently test the unit elements regardless of the test list.

10. The vehicle test system of claim 6, wherein the station manager drives the vehicle along the virtual driving environment map, and controls the driving unit and the unit under detection to test the vehicle according to the test list.

* * * * *